United States Patent [19]

Proebsting

[11] 4,386,389
[45] May 31, 1983

[54] SINGLE LAYER BURN-IN TAPE FOR INTEGRATED CIRCUIT

[75] Inventor: Robert J. Proebsting, Dallas, Tex.

[73] Assignee: Mostek Corporation, Carrollton, Tex.

[21] Appl. No.: 273,847

[22] PCT Filed: Sep. 8, 1980

[86] PCT No.: PCT/US80/01148

§ 371 Date: Sep. 8, 1980

§ 102(e) Date: Sep. 8, 1980

[87] PCT Pub. No.: WO82/00973

PCT Pub. Date: Mar. 18, 1982

[51] Int. Cl.³ .............................................. H05K 1/18
[52] U.S. Cl. .................... 361/406; 174/52 PE; 174/68.5; 361/398; 361/414; 361/421
[58] Field of Search ............... 361/421, 403, 408, 414, 361/398, 406; 174/52 PE, 52 FP, 68.5; 29/593, 835, 838, 839, 840, 853; 324/73 PC; 357/69, 70

[56] References Cited

U.S. PATENT DOCUMENTS

| | | | |
|---|---|---|---|
| 3,832,769 | 9/1974 | Olyphant et al. | 361/398 X |
| 3,838,984 | 10/1974 | Crane et al. | 174/52 PE X |
| 3,969,706 | 7/1976 | Proebsting et al. | 348/173 R |
| 4,056,773 | 11/1977 | Sullivan | 324/73 PC |
| 4,064,552 | 12/1977 | Angelucci et al. | 361/414 |
| 4,132,856 | 1/1979 | Hutchinson | 174/52 PE |
| 4,209,355 | 6/1980 | Burns | 357/70 X |
| 4,281,449 | 8/1981 | Ports et al. | 29/593 |

OTHER PUBLICATIONS

Oswald et al., Automated Tape Carrier Bonding for Hybrids, Solid State Technology, Mar. 1978, pp. 39 to 48.

Primary Examiner—R. R. Kucia

[57] ABSTRACT

A burn-in tape (48) includes a backing (50) and a pair of rectangular openings (56, 58) positioned transversely on the backing (50). Power conductors (52, 54) extend longitudinally on backing (50) outboard of the openings (56, 58). Additional conductor lines (104, 106) extend longitudinally along backing (50) between the openings (56, 58). Conductor strips (62, 70, 80, 88) connect the conductors (104, 52, 106, 54) to bonding pads (12, 20, 30, 38) on an integrated circuit (10). Signal conducting strips (64, 66, 68, 72, 74, 76, 78, 82, 84, 86, 90, 92, 94, 96) extend from corresponding test pads on backing (50) to bonding pads on the integrated circuit (10). The backing (50) is provided with sprocket holes (98) for precisely aligning the burn-in tape (48) with the integrated circuit (10). The conductors on the tape (48) provide a means for operating and thereby burning-in the components of the integrated circuit (10).

14 Claims, 2 Drawing Figures

SINGLE LAYER BURN-IN TAPE FOR INTEGRATED CIRCUIT

TECHNICAL FIELD

The present invention pertains to the burn-in of integrated semiconductor circuits and more particularly to a burn-in tape for exercising such circuits.

BACKGROUND ART

Integrated semiconductor circuits have the potential for operating for long periods of time without failure. However, a substantial percentage of such circuits fail within the first few hours or days of operation due to marginal defects in manufacture. Such marginal circuits frequently test good under initial screening, but fail shortly thereafter. it is therefore incumbent upon the manufacturer of such circuits to burn-in each of the circuits for a period of time at elevated voltages and temperatures to cause failure of the marginal circuits before shipment. Without burn-in a substantial number of marginal circuits could be shipped to users and these circuits would be installed in the user's products only to fail a short time later. A failure of a component under such circumstances has severe economic impacts on both the user and the producer of integrated circuits.

Heretofore, integrated circuits have been burned-in after the circuits have been packaged in the manner that they will be delivered to the customer. A group of packaged circuits are mounted on a convential circuit board which has a plurality of sockets. The board is then placed in an oven for operating the circuits under stress. Within the oven the integrated circuits are cycled through their operational states while an elevated voltage is supplied thereto and the temperature is set to a stress level. After operating for a fixed number of hours in this environment, most of the marginal circuits fail and these circuits are discarded. The remainder of the circuits have been proven reliable and can therefore safely be shipped to the customers.

As noted above, the burn-in of each individual circuit is essential but this is a very expensive process. For each marginal circuit that is discarded there is a complete loss of the labor involved in inserting the circuit into the package as well as the cost of the package itself. In mass production operations, a great number of test boards and ovens are required to accommodate the volume of circuits which are being manufactured. The ovens and stress testing boards together with the labor involved in the handling of the circuits represent a substantial manufacturing expense.

In view of these problems there exists a need for apparatus for burn-in of integrated semiconductor memory circuits to reduce the labor required for such burn-in and to prevent the loss of packages for defective circuits.

DISCLOSURE OF THE INVENTION

The present invention comprises a tape for burning-in a plurality of integrated circuits. The tape comprises an elongate, nonconductive backing together with a plurality of noncrossing conductors bonded to the backing. The conductors can be fabricated from a single layer of metallization on the backing. The conductors extend along the backing for connection to a plurality of the integrated circuits for supplying signals thereto for concurrently exercising the integrated circuits.

BRIEF DESCRIPTION OF THE DRAWINGS

For a more complete understanding of the present invention and the advantages thereof, reference is now made to the following detailed description taken in conjunction with the accompanying drawings in which.

DETAILED DESCRIPTION OF THE INVENTION

Figure 1:
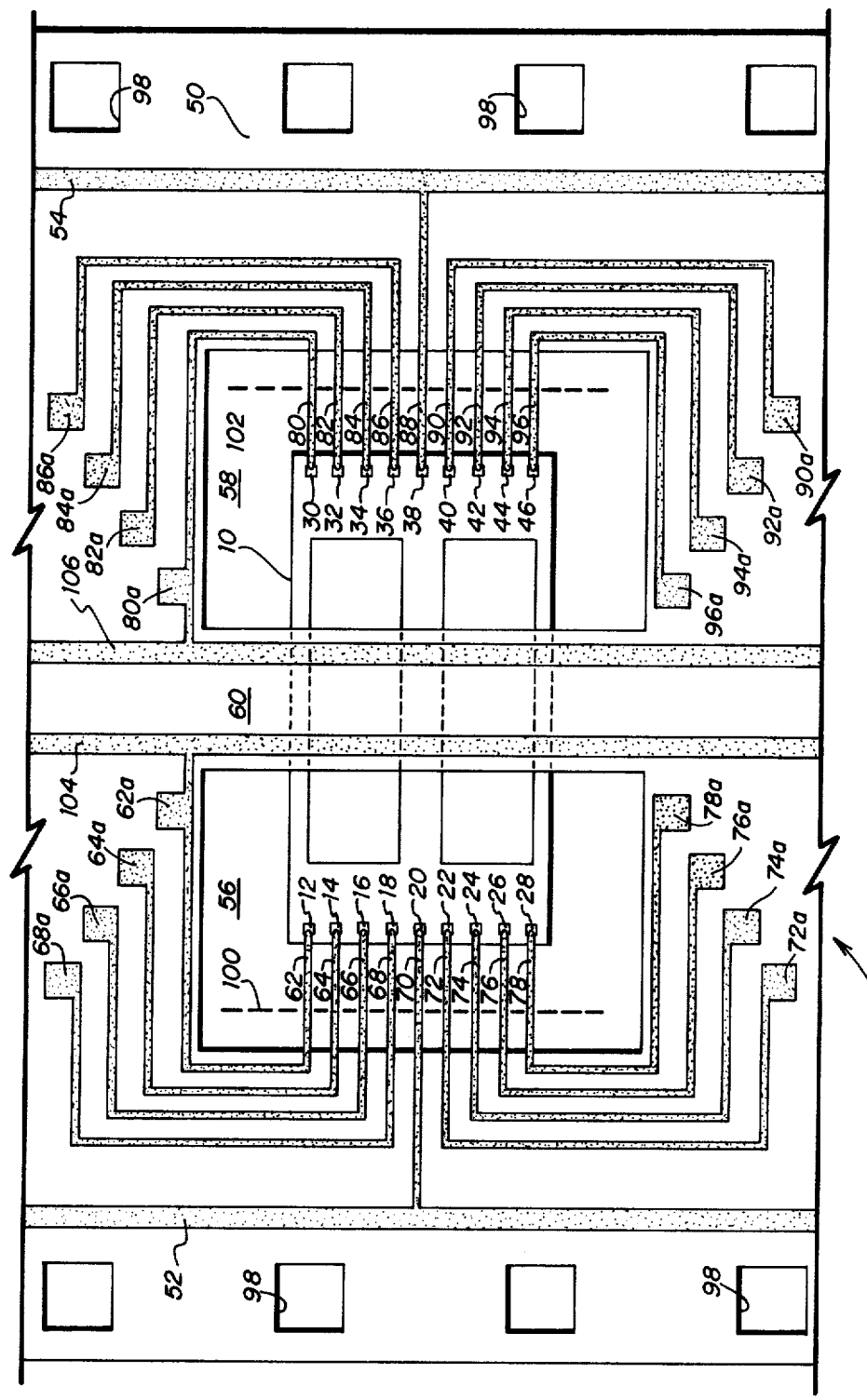
FIG. 1 is a plan view of a burn-in tape having an integrated circuit semiconductor memory connected thereto.

A procedure termed "tape bonding" has been widely used in the semiconductor industry for connecting bonding pads on an integrated circuit to the pins in the circuit package. The burn-in tape of the present invention is illustrated in reference to FIG. 1. After a silicon wafer has undergone fabrication to produce a plurality of replicated circuits, the wafer is cut to separate each of the circuits to be an individual chip. An individual semiconductor memory chip produced in this fashion is shown by reference numeral 10. During the process of manufacture, chip 10 is provided with a plurality of bonding pads 12–46, each of which provides a connection to the circuit included on chip 10.

The bonding process is carried out with a continuous tape 48 which comprises an insulating backing 50 together with a single layer of metallization which has been etched to produce a plurality of conductor lines. The tape 48 is provided with continuous power bus lines 52 and 54 which in most applications are designated as the supply voltage bus and ground. Tape 48 is provided with openings 56 and 58 on either side of a bridge 60.

The metallization pattern on tape 48 includes a plurality of conductive leads which extend from tape 48 into the openings 56 and 58. One lead is provided for each of the bonding pads on the chip 10. Leads 62–78 are connected respectively to bonding pads 12–28. Likewise, leads 80–96 are connected respectively to bonding pads 30–46. The signal conducting leads 62–68, 72–78, 80–96 and 90–96 are each connected to a corresponding test pad 62a–68a, 72a–78a, 80a–86a and 90a–96a on tape 48. Test probes (not shown) are placed in contact with the test pads to control and test the operation of the integrated circuit while mounted on the tape 48.

Tape 48 is provided with sprocket holes 98 which engage sprockets that move the tape into an accurate position for automatically bonding the leads to the bonding pads of the integrated circuit, and for aligning the tape to receive test probes.

In the conventional tape bonding procedure the integrated circuit 10 is connected to the extending leads as shown in FIG. 1 and the leads are then severed along dotted lines 100 and 102 for disconnecting chip 10 from tape 48 and thereby providing the chip with lines for connection to the pins in the chip package. In a further manufacturing step the various leads are simultaneously bonded to pads in a package which are in turn connected to the pins which extend from the package to enable electrical connection from the chip to a printed circuit board.

Heretofore, the tape bonding procedure has been used solely as a method for rapidly and inexpensively connecting bonding leads to the integrated circuit. But in the present invention, the use of the tape is expanded and additional conductor lines are added to the tape such that the memory chip 10 can be burned-in while it is attached to the tape. Such burning-in can be carried out when the chip 10 itself is provided with additional circuitry to permit operation without connections to all inputs 12-46 of the circuit 10.

There are provided two conducting lines 104 and 106 which extend longitudinally along tape 48 and pass over the bridge 60. Control signals are transmitted through these two conductor lines to cause burning-in of the chip 10 when the chip is provided with the burn-in circuit described in reference to FIG. 2. Note that line 104 is connected to bonding pad 12 through lead 62 and line 106 is connected to bonding pad 30 through lead 80. Thus, the chip 10 is provided with four connections thereto, the two control lines 104 and 106 together with the power lines 52 and 54. Note that none of the conductor lines on tape 48 cross so that there can be etched out of a single conductive layer.

The configuration of tape and conductors illustrated in FIG. 1 is repeated along tape 48 such that a plurality of integrated circuits can be burned-in simultaneously. Note that the chip 10 has the bonding pads fabricated at opposing ends of the chip. With this fabrication configuration the maximum number of conductors which can be fabricated on tape 48 to extend along the length of the tape without crossovers and using only a single layer of metallization is four.

The chip 10 is an integrated circuit which has a first set of terminals selected from the bonding pads 12-46 normally used to receive power, addresses, data and operational command signals to operate the circuit. With the present invention the chip 10 can be exercised through a second set of terminals selected from the bonding pads 12-46. The second set of terminals may or may not include terminals in the first set. The chip 10 is typically a memory circuit but other types of integrated circuits, such as microprocessors, can equally well be exercised in this manner.

Figure 2:
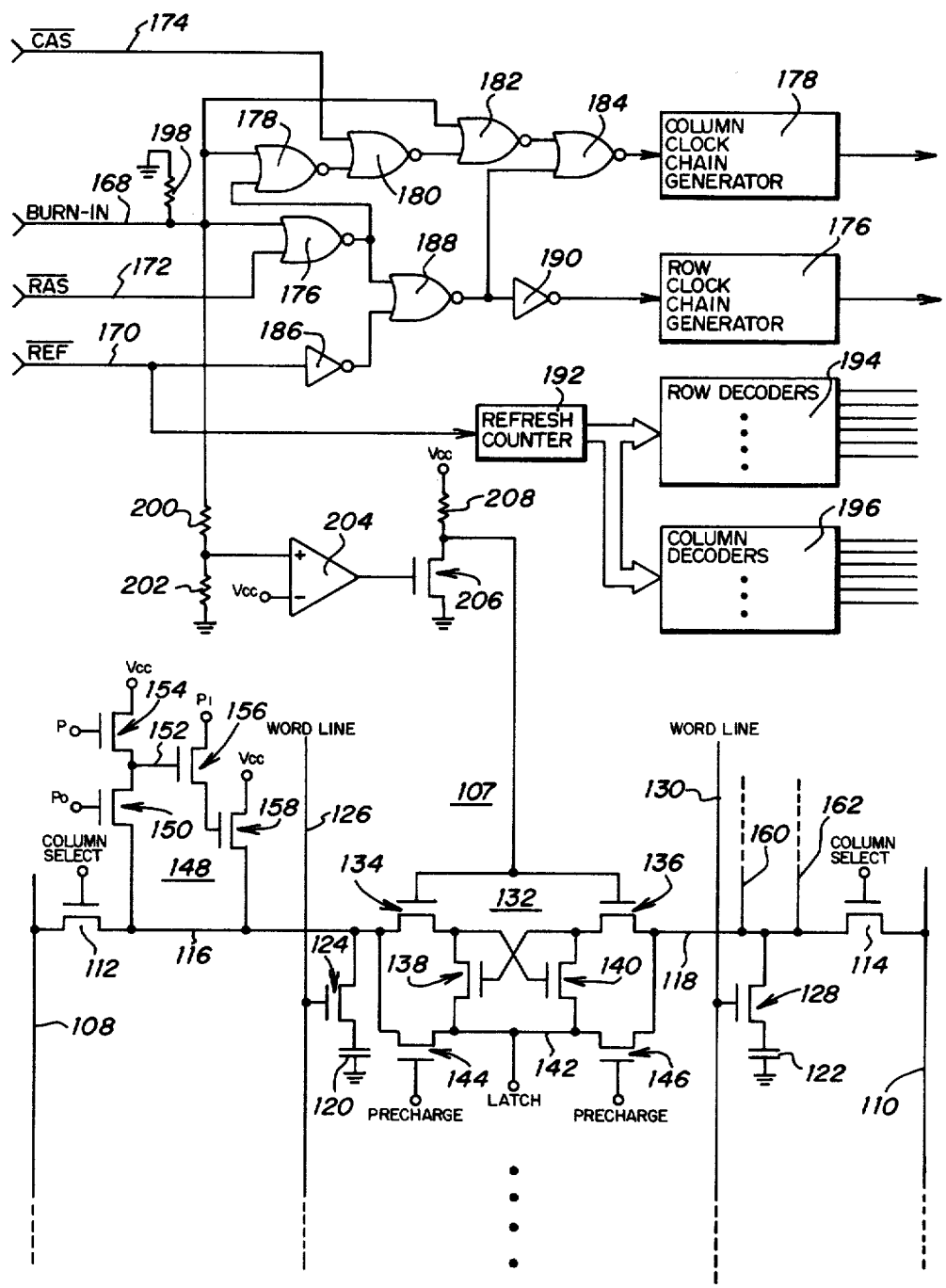
FIG. 2 is a schematic diagram of a burn in circuit for use in conjunction with the tape of the present invention.

The circuit for use in conjunction with the signals transmitted over lines 104 and 106 for burning-in semiconductor chip 10 is illustrated in FIG. 2. Voltage states representing binary information are supplied to a memory array 107 through input/output lines 108 and 110. These lines are connected through column select transistors 112 and 114 to digit lines 116 and 118. Column select signals are provided to activate transistors 112 and 114 to connect the input/output lines 108 and 110 to the corresponding digit lines 116 and 118.

Information is retained in the memory as a voltage state on a storage capacitor. Capacitors 120 and 122 are illustrative of the plurality of storage capacitors included within a semiconductor memory. An access transistor 124 connects capacitor 120 to digit line 116. The gate terminal of transistor 124 is connected to a word line 126 which receives commands to activate transistor 124 and thereby connect capacitor 120 to digit line 116. The terms word line and row line are interchangeable. Likewise, an access transistor 128 connects capacitor 122 to digit line 118. A word line 130 is connected to the gate terminal of transistor 128 to control the operation thereof and selectively connect capacitor 122 to digit line 118. A plurality of access transistors and corresponding memory cells are connected along each of the word lines 126 and 130 within the semiconductor memory. When a word line, such as 126, receives an activation signal, all of the access transistors along the word line will be simultaneously activated to connect the corresponding storage capacitors to the corresponding digit lines. However, only one memory cell is connected to a digit line at any one given time.

Each pair of digit lines, such as 116 and 118 are connected to a sense amplifier such as amplifier 132. A transistor 134 is provided for connecting amplifier 132 to digit line 116 and a transistor 136 is provided for connecting digit line 118 to amplifier 132.

Sense amplifier 132 comprises transistors 138 and 140 which have the source terminals thereof connected in common to a latch node 142. The drain terminal of transistor 138 and the gate terminal of transistor 140 are connected to transistor 134 while the drain terminal of transistor 140 and the gate terminal of transistor 138 are connected to transistor 136.

The voltages on digit lines 116 and 118 are equalized by operation of precharge transistors 144 and 146. The drain and source terminals of transistor 144 are connected between digit line 116 and the latch node 142 and the source and drain terminals of transistor 146 are connected between digit line 118 and latch node 142. A precharge signal is provided to the gate terminals of transistors 144 and 146 to turn these transistors on and equilibrate the voltages on lines 116 and 118 between memory cycles.

Each of the digit lines in the semiconductor memory is provided with a pullup circuit such as circuit 148 shown in FIG. 2. Pullup circuit 148 includes a transistor 150 which has the source terminal connected to digit line 116 and the drain terminal connected to a node 152. The gate terminal of transistor 150 is connected to receive a $P_o$ signal. A transistor 154 has the source terminal connected to node 152 and the drain terminal connected to the power supply $V_{cc}$. The gate terminal of transistor 154 is connected to receive a P signal. Pullup circuit 148 further includes a transistor 156 which has the gate terminal thereof connected to node 152 and the drain terminal thereof connected to receive a $P_1$ signal. The source terminal of transistor 156 is connected to the gate terminal of a transistor 158. The drain terminal of transistor 158 is also connected to the power supply $V_{cc}$ while the source terminal of transistor 158 is connected to digit line 116. Note that a pullup circuit such as circuit 148 is connected to each of the digit lines within the memory circuit, such a duplication of circuits is indicated by lines 160 and 162 connected to digit line 118.

The operation of the memory circuit 107 is described in reference to FIG. 2. Before any read or write operation is undertaken with circuit 107, the voltages on digit lines 116 and 118 are equilibrated by operation or precharge transistors 144 and 146. These transistors are activated by a precharge signal which is applied to the gate terminals thereof to cause the transistors to be rendered conductive. When the precharge transistors are in the conductive state, the latch node 142 is connected to the digit lines 116 and 118. This connection causes the voltages on lines 116 and 118 to be eventually balanced and have approximately the same charge thereon. In a preferred embodiment, the voltage on lines 116 and 118 is driven to 2.0 volts by operation of the precharge transistors.

In order to read the data state stored in a storage capacitor, such as capacitor 120, a signal is applied to the word line 126 to cause activation of access transistor 124 which then connects digit line 116 to capacitor 120. If a high voltage state has previously been stored on capacitor 120, the digit line 116 is elevated by a few tenths of a volt. But if a low voltage state has previously been stored on capacitor 120, the digit line 116 will be reduced in voltage by a few tenths of a volt. After a memory cell is connected to a digit line, one of the digit lines 116 and 118 will have a lesser voltage thereon. After the storage capacitor has been connected to the digit line, a latch signal is applied to the latch node 142 of sense amplifier 132. This signal descends relatively slowly from an initial voltage state to a low voltage state. During the downward transistion of the signal on latch node 142, one of the two transistors 138 or 140 will be gradually turned on to cause the digit line connected to the conductive transistor to be discharged. The line with the lesser voltage will be discharged through the latch node to essentially zero volts. The digit line with the greater voltage will not be discharged. The operation of sense amplifier 132 causes the small voltage differential produced by a storage capacitor to be transformed into a substantial voltage differential between digit lines 116 and 118 and this voltage differential can be transmitted to the input/output lines 108 and 110 through the column select transistors.

After the sense amplifier 132 has completed its function of discharging one of the two digit lines connected thereto, the pullup circuit 148 is activated by a sequence of the signals P, $P_o$ and $P_1$. The P signal is supplied initially to precharge node 152 and is turned off before occurance of the other signals. The $P_o$ signal follows the P signal and goes from 0.0 volts to approximately 1.0 volts. If the digit line 116 has been discharged by operation of sense amplifier 132, transistor 150 will be turned on by signal $P_o$ thereby discharging node 152. But if digit line 116 has remained at a charged state of approximately 2.0 volts, transistor 150 will not be turned on and node 152 will remain charged at its initial 5.0 volt level. The $P_1$ signal arrives after the $P_o$ signal and the $P_1$ signal is transmitted to the gate terminal of transistor 158 if node 152 has not been discharged. When signal $P_1$ is applied to the gate of transistor 158 the supply voltage $V_{cc}$ is coupled to digit line 116. This line is then pulled to the full supply voltage. But if node 152 has been discharged, the $P_1$ signal will not activate transistor 158 and no change will be made to the voltage state on digit line 116. Therefore, it can be seen from the above description that the pullup circuit 148 causes the digit line with the remaining elevated voltage to be pulled to the full voltage state of the supply voltage $V_{cc}$. However, the digit line discharged by the sense amplifier 132 will not be affected by operation of pullup circuit 148. While the pullup operation is occurring, an elevated voltage is applied to word line 126 to transfer the voltage state on digit line 116 into the storage capacitor 120.

The burn in circuit for use with the memory array circuit 107 is now described in reference to FIG. 2. The conductor line 104 on tape 48 is connected to a burn-in terminal 168 while the conductor line 106 is connected to the refresh ($\overline{REF}$) terminal 170.

The memory 107 operates in the normal sense in response to a $\overline{RAS}$ (row address strobe) signal which is received at terminal 172 and a $\overline{CAS}$ (column address strobe) signal which is received at terminal 174. When the memory circuit 100 is installed as a part of a user's device, the signals $\overline{REF}$, $\overline{RAS}$ and $\overline{CAS}$ will be supplied from external circuitry to control operation of the memory circuit 107. In particular the $\overline{RAS}$ signal going to a logical 0 causes generation of row clock chain signals by the row clock chain generator 176. The $\overline{CAS}$ signal going to a logical 0 in conjunction with a logical 0 on the $\overline{RAS}$ signal produces column clock chain signals by activation of a column clock chain generator 178.

When the memory chip 10 is mounted on the tape 48 for burn in, there will be no signal supplied to the $\overline{RAS}$ and $\overline{CAS}$ terminals 172 and 174. The only inputs will be the power terminals and the inputs to the burn-in terminal 168 connected to line 104 and the $\overline{REF}$ terminal 170 connected to line 106. The signals on these two lines must be utilized in such a manner as to simulate receipt of commands on the $\overline{RAS}$ and $\overline{CAS}$ terminals.

The burn-in terminal 168 is connected as a first input to a NOR gate 176. The second input to gate 176 is connected to the $\overline{RAS}$ terminal 172. The output of NOR gate 176 is connected as a first input to a NOR gate 178 which has the burn-in signal on line 168 provided as the second input thereto.

The CAS signal is provided through terminal 174 to a first input of a NOR gate 180. The output of NOR gate 178 is connected at the second input to gate 180. The burn-in signal transmitted through terminal 168 is also connected as a first input to a NOR gate 182 which receives the output of gate 180 as the second input.

The output of NOR gate 182 is provided as a first input to a NOR gate 184 which has the output thereof connected to drive the column clock chain generator 178.

The refresh signal on terminal 170 is connected to the input of an inverter 186 which has the output thereof connected as the first input to a NOR gate 188. The second input to NOR gate 188 is received from the output of NOR gate 176. The output from NOR gate 188 is provided as a second input to NOR gate 184 and as the input to inverter 190. The row clock chain generator 176 is driven in response to the output from inverter 190.

The refresh signal, $\overline{REF}$, provided on terminal 170 is transmitted to a refresh counter 192 that generates a sequence of addresses which are provided to row decoders 194 and column decoders 196. The row decoders 194 select the addressed word lines within memory array 107 and the column decoders 196 activate the addressed column select transistors for each digit line, such as transistors 112 and 114.

A resistor 198 is connected between burn-in terminal 168 and ground to hold this terminal at ground potential when no input signal is supplied thereto.

Terminal 168 is further connected to a voltage divider network comprising resistors 200 and 202. Resistor 202 has one terminal thereof connected to ground. Preferred values for these resistors are 3K ohms for resistor 200 and 6K ohms for resistor 202. The junction of these two resistors is connected to the non-inverting input of a differential amplifier 204. The inverting input of amplifier 204 is connected to the voltage source $V_{cc}$. The output of amplifier 204 is connected to the gate terminal of a transistor 206 which has the source terminal thereof grounded. The drain terminal of transistor 206 is connected to a load resistor 208 which has the remaining terminal thereof connected to the supply voltage $V_{cc}$. The drain terminal of transistor 206 is also connected to the gate terminals of transistors 134 and 136, and all similar transistors throughout memory array 107.

The purpose of the present invention is to provide burn-in for the integrated circuit memory chip 10 while the circuit is attached to the tape 48. After the circuit has undergone burn-in, it is then tested while still mounted on tape 48 using pads 62a–68a, 72a–78a, 80a–86a and 90a–96a. If the circuit proves to be functional it is then, and only then, incorporated into a package to constitute the final product. When the integrated circuit chip 10 is bonded to the tape 48, four connections ar made to the circuitry on the chip for burn in. The supply voltage and ground terminals are connected to the appropriate pads on the chip. Further, as noted above, line 104 is connected to the burn-in terminal 168 of the semiconductor memory circuit and the line 106 is connected to the refresh pin 170 for the circuit. After the circuit has been tested and packaged there will be no connection made to the burn-in terminal 168. With no connection to terminal 168, resistor 198 maintains a logic 0 on terminal 168.

A burn-in command is supplied to the burn-in terminal 168 during burn-in of the circuit 10. This command has two active states; a first state, which is approximately 8.0 volts, is applied to cause a block write of a high voltage state into all of the memory cells in memory array 107, and a second state of approximately 5.0 volts is provided to sequentially exercise all rows and all columns of memory array 107.

When the burn-in command is at the high voltage level, 8.0 volts, the voltage at the junction of the voltage divider resistors 200 and 202 will be in excess of $V_{cc}$ which is normally 5.0 volts. The output of differential amplifier 204 is normally a logical 0, but upon application of the high burn-in voltage, the output of differential amplifier 204 will transition from a logical 0 to a logical 1. When the output of amplifier 204 is a logical 0, the transistor 206 is turned off, and resistor 208 supplies voltage $V_{cc}$ to the gate terminals of transistors 134 and 136. The application of this voltage to the gate terminals causes these transistors to be turned on and to connect sense amplifier 132 to digit lines 116 and 118. This is the normal operating condition for the memory array 107. But when the output of amplifier 204 goes to a high level, transistor 206 is turned on thereby applying a low voltage state to the gate terminals of transistors 134 and 136. This low voltage causes transistors 134 and 136 to be turned off thereby isolating sense amplifier 132 from digit lines 116 and 118. When the sense amplifier is disconnected from the digit lines it cannot pull either of the digit lines to ground potential when the latch signal applied to node 142 goes to ground. As a result, the pullup circuits associated with each of the digit lines will cause the corresponding digit line to be pulled to the supply voltage, $V_{cc}$. Thus, after one operational cycle all of the digit lines will have high voltage levels applied thereto and these high voltage levels will be transferred into the memory cells along the addressed word line. Therefore, independent of what column is selected, all cells in the selected row are written to the high voltage state. As will be described below, all word lines will be sequentially selected so that all cells in memory array 107 will be written to the high voltage state. The high voltage state is applied to all storage capacitors to apply the maximum possible stress condition to each capacitor during burn-in.

The refresh counter 192 produces a sequence of all possible word line addresses to the memory array 107. Each time the refresh signal 170 is activated the word line corresponding to the refresh counter address is selected and the refresh counter is incremented to the next address. In normal operation this is used to refresh the logic states of all memory cells in array 107. When a cycle is initiated by the refresh command, if conditions are established for a column to be selected, the column address will be the same as the row address, both being provided by the refresh counter 192.

A clock signal applied to the refresh terminal 170 causes the refresh counter 192 to cycle through its various states. Counter 192 produces in sequence each of the addresses for the row and column decoders in the memory circuit 107. In this case, the same address is applied to the row decoders 194 and the column decoders 196. When the burn-in terminal 168 is at a logical 1, the logic shown at the top of FIG. 2, to be described below, causes the $\overline{REF}$ input 170 to select both the row and the column addressed by refresh counter 192. Thus, when the burn-in command is at a logical 1, either 5.0 volts or 8.0 volts, and a sequence of clock signals is applied to the refresh line 170, the memory cells which have column address the same as row address will be sequentially addressed by the operation of the refresh counter. When the burn-in command is at the 8.0 volt level, as described above, all cells in a row are simultaneously written high. With the sequencing of the rows by the refresh counter 102, all cells in the memory array 107 are established at the high stress condition even though only the memory cells whose column address is identical to the row address are actually selected.

When the burn-in command is at the 5.0 volt level the sense amplifiers, such as 132, are activated so that they receive the stress of operation. Likewise all rows are sequentially operated to receive stress as are all columns and other elements such as clock generators, address buffers, row decoders, column decoders and memory cells.

During burn-in the burn-in command on line 168 would normally be at 8.0 volts for sufficient refresh cycles to establish the high stress condition in all cells. Thereafter the burn-in command would be reduced to 5.0 volts to exercise essentially all of the elements of the integrated circuit for the duration of the burn-in.

In normal operation of the memory circuit, the $\overline{RAS}$ and $\overline{CAS}$ signals must be provided from external sources to cause operation of the row clock chain generator 176 and column clock chain generator 178. But in the burn-in condition for stressing the circuit, no input signals are provided on lines 172 and 174. Thus, the signal on the refresh pin must cause the equivalent result to receiving both $\overline{RAS}$ and $\overline{CAS}$ signals.

The $\overline{RAS}$ signal produces two results when it is in the low (active) state. First, it activates the row clock chain generator 176 and second, it enables the operation of the $\overline{CAS}$ signal. In normal operation the burn-in terminal 168 is pulled to a low level thereby causing NOR gate 176 to operate as an inverter. Similarly, under such circumstances, the $\overline{REF}$ signal on terminal 170 is at a high state which is transformed to a low state at the output of inverter 186. This causes NOR gate 188 to function as an inverter as well. Thus, when the $\overline{RAS}$ signal on line 172 is at a low state the output of NOR gate 176 is at a high state, the output of NOR gate 188 is at a low state and the output of inverter 190 is at a high state to activate row clock chain generator 176.

Further, under normal operations, the NOR gate 178 operates as an inverter and the $\overline{RAS}$ signal inhibits the $\overline{CAS}$ signal when the $\overline{RAS}$ signal is in a high state. When the signal on terminal 172 is high, the output of NOR gate 176 is low and the output of NOR gate 178 is high thereby driving the output of NOR gate 180 low regardless of the state of the $\overline{CAS}$ signal on line 174. But when the $\overline{RAS}$ signal on terminal 172 is low, the output of NOR gate 176 is high, and the output of NOR gate 178 is low thereby permitting the active (low) $\overline{\text{CAS}}$ signal to propagate through NOR gate 180.

When the $\overline{\text{CAS}}$ signal on line 174 is in a low state and the $\overline{\text{RAS}}$ signal on terminal 172 is in a low state, the output of NOR gate 180 is driven to a high state, the output of NOR gate 182 is driven to a low state which in turn drives the output of NOR gate 184 to a high state since the output of NOR gate 188 is in a low state. This activates the column clock chain generator 178.

In the burn-in mode no inputs will be supplied for the $\overline{\text{RAS}}$ signals and $\overline{\text{CAS}}$ signals. The burn-in command on terminal 168 will however be high. This drives the output of NOR gate 176 to a low state therefore making NOR gate 188 function as an inverter. The high state on line 168 also drives the output of NOR gate 178 to a low state, the output of NOR gate 180 to a high state since $\overline{\text{CAS}}$ is low and the output of NOR gate 182 to a low state. This permits the remaining input to NOR gate 184 to control the output thereof.

Therefore, when the $\overline{\text{REF}}$ signal on terminal 170 goes to a low state, the output of inverter 186 is driven high, the output of NOR gate 188 is driven low and the output of inverter 190 is driven high thereby activating row clock chain generator 176. The output of NOR gate 188 is connected as an input to NOR gate 184. When this output goes low, the output of NOR gate 184 is driven high thereby activating the column clock chain generator 178.

From the above it can be seen that when the burn-in command on the burn-in terminal 168 is in a high state, 5 volts or 8 volts, the row and column clock chain generators will be activated by the $\overline{\text{REF}}$ signal transitioning from a high level to a low level. As $\overline{\text{REF}}$ toggles between these two states, the row and column clock chain signals are repeatedly generated. The toggling further causes the refresh counter 192 to generate sequential address signals that are applied to the row and column decoders 194 and 196. When the burn-in command to the burn-in terminal 168 is at the 5.0 volt level, the transistors 134 and 136 are rendered conductive thereby connecting the sense amplifier 132 to the digit lines 116 and 118. When the memory cells are read in accordance with the addresses generated by the refresh counter 192, the sense amplifier for each of the digit lines is likewise stressed and caused to operate in its normal manner. The high state initially written into all the memory cells is maintained by these repetitive memory cycles. Thus, after the high level voltage states are established in each of the memory cells, the memory can be operated in the sequential mode in response to the clock signal provided to the REF terminal 170 to stress the memory cells, the sense amplifiers, the row and column clock chain circuitry, the row decoders, the column decoders, the data output circuit and the pullup circuits. All circuits so exercised constitute well over 99% of the circuit components within the semiconductor memory.

In a normal burn-in sequence the burn-in command provided to the burn-in terminal 168 is elevated to the 8.0 volt level for approximately 0.25 milliseconds during which time the $\overline{\text{REF}}$ signal is clocked at least 256 times. In a memory circuit having this number of rows and columns, this operation will cause the high voltage state to be written into each of the memory cells. After the burn-in command is at the 8.0 volt level for 0.25 milliseconds, it is lowered to the 5.0 volt level. The clock signal provided through the $\overline{\text{REF}}$ terminal 170 is clocked at the same rate as before to repeatedly stress the circuit components within the memory.

The sequence of burning-in is carried out for a period of hours at elevated temperatures to cause failure of marginal chips and insure the reliability of those chips which successfully complete the burn-in. The supply voltage $V_{cc}$ can be elevated at the same time to further stress the chips.

Although one embodiment of the invention has been illustrated in the accompanying drawings and described in the foregoing detailed description, it will be understood that the invention is not limited to the embodiment disclosed, but is capable of numerous rearrangements, modifications and substitutions without departing from the scope of the invention.

I claim:

1. A tape for burning in an integrated circuit having at least three terminals for receiving signals which serve to exercise the circuit, comprising:
   an elongate, nonconductive backing having a plurality of openings arranged longitudinally along said backing;
   first and second conductors bonded to said backing and extending longitudinally thereon, said first conductor positioned between said openings and a first outer edge of said backing and said second conductor positioned between said openings and a second outer edge of said backing;
   a third conductor bonded to said backing and extending longitudinally along said backing between the outboard edges of said openings; and
   a conducting strip bonded to said backing for each of said conductors for each of said openings, said conducting strips connected to the corresponding conductor and extending into said openings for respective contact to the terminals of said integrated circuit.

2. The tape recited in claim 1 having sprocket holes therein adjacent at least one edge of said backing.

3. The tape recited in claim 1 wherein all of said conductors are bonded on the same surface of said backing.

4. The tape recited in claim 1 further including a plurality of electrically isolated signal conductors for each of said openings, each signal conductor bonded to said backing and extending into the corresponding opening and having a test pad connected thereto on said backing.

5. A tape for burning-in an integrated circuit having at least four terminals for receiving signals which serve to exercise the circuit, comprising:
   an elongate, nonconductive backing having a plurality of openings arranged longitudinally along said backing;
   first and second conductors bonded to said backing and extending longitudinally thereon, said first conductor positioned between said openings and a first outer edge of said backing and said second conductor positioned between said openings and a second outer edge of said backing;
   third and fourth conductors bonded to said backing and extending longitudinally along said backing between the outboard edges of said opening; and
   a conducting strip bonded to said backing for each of said conductors for each of said openings, said conducting strips connected to the corresponding conductor and extending into said openings for contact with the terminals of said integrated circuits.

6. The tape recited in claim 5 having sprocket holes therein outboard of said first and second conductors adjacent at least one edge of said backing.

7. The tape recited in claim 5 wherein all of said conductors are bonded on the same surface of said backing.

8. The tape recited in claim 5 further including a plurality of electrically isolated signal conductors for each of said openings, each signal conductor bonded to said backing and extending into the corresponding opening and having a test pad connected thereto on said backing.

9. A tape for burning-in an integrated circuit having at least four terminals for receiving signals which serve to exercise the circuit, comprising:
- an elongate, nonconductive backing having a plurality of pairs of openings arranged longitudinally along said backing;
- first and second conductors bonded to said backing and extending longitudinally thereon, said first conductor positioned between said openings and a first outer edge of said backing and said second conductor positioned between said openings and a second outer edge of said backing;
- third and fourth conductors bonded to said backing and extending longitudinally along the center portion of said backing and between the openings for each of said pairs of openings; and
- a conducting strip bonded to said backing for each of said conductors for each of said pairs of openings, said conducting strips connected to the corresponding conductor and extending into said openings for contact with the terminals of said integrated circuits.

10. The tape recited in claim 9 having sprocket holes outboard of said first and second conductors adjacent at least one edge of said backing.

11. The tape recited in claim 9 wherein said conductors are bonded on the same surface of said backing.

12. The tape recited in claim 9 further including a plurality of electrically isolated signal conductors for each of said pairs of openings, each signal conductor bonded to said backing and extending into one of said openings of the corresponding pair of openings and having a test pad connected thereto on said backing.

13. The tape recited in claim 9 wherein the centers of said openings for each of said pairs of openings are positioned along a line transverse to said backing.

14. A tape for testing an integrated circuit having at least four terminals for receiving signals which serve to operate the circuit, comprising:
- an elongate, nonconductive backing having a plurality of pairs of openings arranged longitudinally along said backing, said openings for each of said pairs positioned transversely to said backing;
- first and second conductors bonded to said backing on a first surface thereof and extending longitudinally thereon, said first conductor positioned between said openings and a first outer edge of said backing and said second conductor positioned between said openings and a second outer edge of said backing;
- third and fourth conductors bonded to said first surface of said backing and extending longitudinally along the center portion of said backing and between the openings for each of said pairs of openings;
- a conducting strip bonded to said first surface of said backing for each of said conductors for each of said pairs of openings, said conducting strips connected to the corresponding conductor and extending into said openings for contact with the terminals of said integrated circuits;
- a plurality of electrically isolated signal conductors for each of said pairs of openings, each signal conductor bonded on said first surface of said backing, and extending into one of said openings; and
- a test pad bonded on said first surface of said backing for each of said signal conductors, each of said test pads connected to the corresponding signal conductor.

* * * * *